United States Patent [19]

Seo

[11] Patent Number: 5,471,186

[45] Date of Patent: Nov. 28, 1995

[54] MAGNETIC PENCIL FOR MOVING SEMICONDUCTOR PACKAGES

[75] Inventor: Jung Y. Seo, Kyeongsangbuk-do, Rep. of Korea

[73] Assignee: Goldstar Electron Co., Ltd., Cheongju, Rep. of Korea

[21] Appl. No.: 141,163

[22] Filed: Oct. 20, 1993

[30] Foreign Application Priority Data

Oct. 20, 1992 [KR] Rep. of Korea .................. 92-20184

[51] Int. Cl.$^6$ ........................................... B66C 1/04
[52] U.S. Cl. .................................... 335/285; 294/65.5
[58] Field of Search ........................ 335/285, 295; 294/65.5

[56] References Cited

U.S. PATENT DOCUMENTS

| | | | |
|---|---|---|---|
| 512,381 | 1/1894 | Keyes | 294/65.5 |
| 2,218,825 | 10/1940 | Guillou | 294/65.5 |
| 4,189,230 | 2/1980 | Zasio | 355/76 |
| 4,213,698 | 7/1980 | Firtion | 355/77 |
| 5,067,763 | 11/1991 | Aoyama | 294/65.5 |

*Primary Examiner*—Leo P. Picard
*Assistant Examiner*—Raymond M. Barrera
*Attorney, Agent, or Firm*—Alan R. Loudermilk

[57] ABSTRACT

A magnetic pencil for moving semiconductor devices is disclosed, which includes a tubular housing provided with two pin holes; a hollow push rod inserted into the housing, and having guide slots at positions corresponding to the pin holes of the housing, with its upper end being closed; an insertion rod inserted into the hollow push rod, with a magnet attached on the lower tip thereof, and with screw holes provided at positions corresponding to the guide slots; and a spring fitted between the upper tip of the insertion rod and the closed upper end of the push rod. In the assembled state, guide pins are provided between the holes of the housing and the screw holes of the insertion rod through said guide slots, respectively. When the magnetic pencil is positioned uprightly by gripping with the fingers of an operator, a semiconductor device is attached to the magnet slightly projected from the lower tip of the pencil. The semiconductor device is moved as much as intended, and then, the closed upper end which forms the projected portion of the push rod is pressed down. The guide pins are guided relatively along the guide slots of the push rod, and this permits the attached semiconductor device to be pushed down by the push rod, thereby separating the semiconductor device from the magnet.

11 Claims, 2 Drawing Sheets

5,471,186

MAGNETIC PENCIL FOR MOVING SEMICONDUCTOR PACKAGES

FIELD OF THE INVENTION

The present invention relates to a fixture for moving individual semiconductor devices, and more particularly to a magnetic pencil for moving packaged semiconductor devices.

BACKGROUND OF THE INVENTION

Currently-used vacuum rods or vacuum pencils for moving packages of semiconductor devices typically are formed such that a vacuum is formed by means of a vacuum generator or tube, and thereby suction-securing of semiconductor devices is possible so as to move the devices. In addition, a magnetic pencil has been used to catch semiconductor devices, and the devices may be moved by means of the magnetic force that attracts the metallic lead frame provided in the semiconductor packages.

In the case of the conventional vacuum rod discussed above, the moving distance between the vacuum generator and a semiconductor holder is limited, and the vacuum line often makes the work troublesome. In the case of the vacuum pencil, when the pencil catches a semiconductor device, the vacuum force may quickly decrease, with the result that the semiconductor device may be dropped. In the case of the magnetic pencil, the surface of the package can be scratched, and the semiconductor device which is attached to the magnetic pencil has to detached by hand, with the result that the semiconductor device may be contaminated.

SUMMARY OF THE INVENTION

The present invention is intended to overcome disadvantages of the above-described conventional techniques. Therefore, it is an object of the present invention to provide a magnetic pencil for moving semiconductor packages, with which work may be conducted in a convenient manner, with little apprehension of dropping the semiconductor devices during movement, while the semiconductor devices may be detached in an easy manner without contamination.

In achieving the above object, the device of the present invention includes: a housing having a tubular shape and provided with pin holes; a hollow push rod inserted into the housing, and having guide slots at positions corresponding to the pin holes of the housing, with its lower tip being open; an insertion rod inserted into the hollow push rod, with a magnet attached to the lower tip thereof and having a projected portion extending from the upper tip thereof, and with screw holes provided at positions corresponding to the guide slots of the push rod; and a spring for being fitted between the upper tip of the insertion rod and the closed upper end.

In the assembled state of the magnetic pencil of the present invention, guide pins are provided between the pin holes of the housing and the screw holes of the insertion rod, passing through the guide slots, respectively.

Further, the projected portion of the push rod extended above the housing has to be high enough to separate the semiconductor device which is attached to the lower end of the insertion rod.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENT

Figure 1:
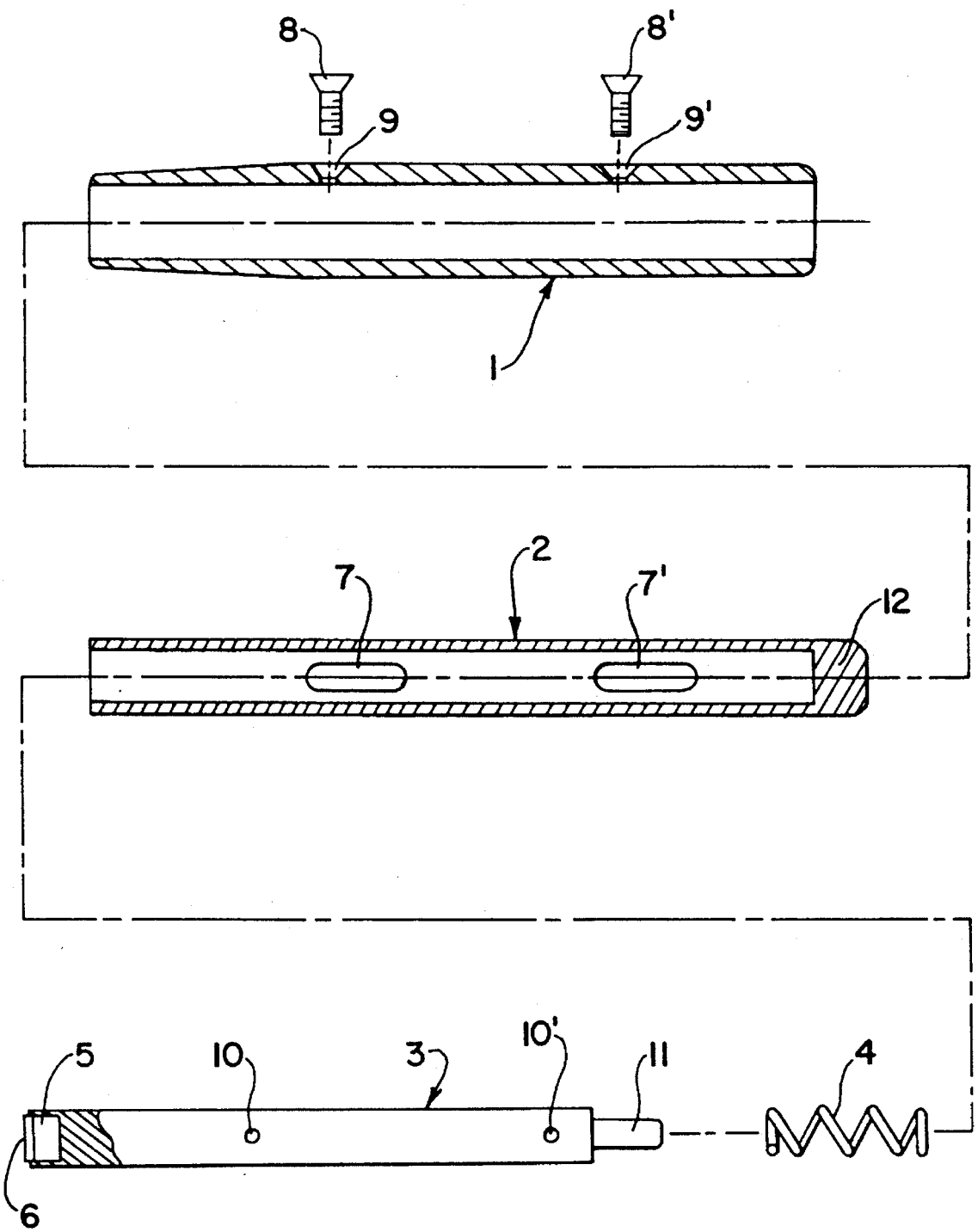
FIG. 1 is an exploded sectional view of an embodiment of the present invention.
Figure 2:
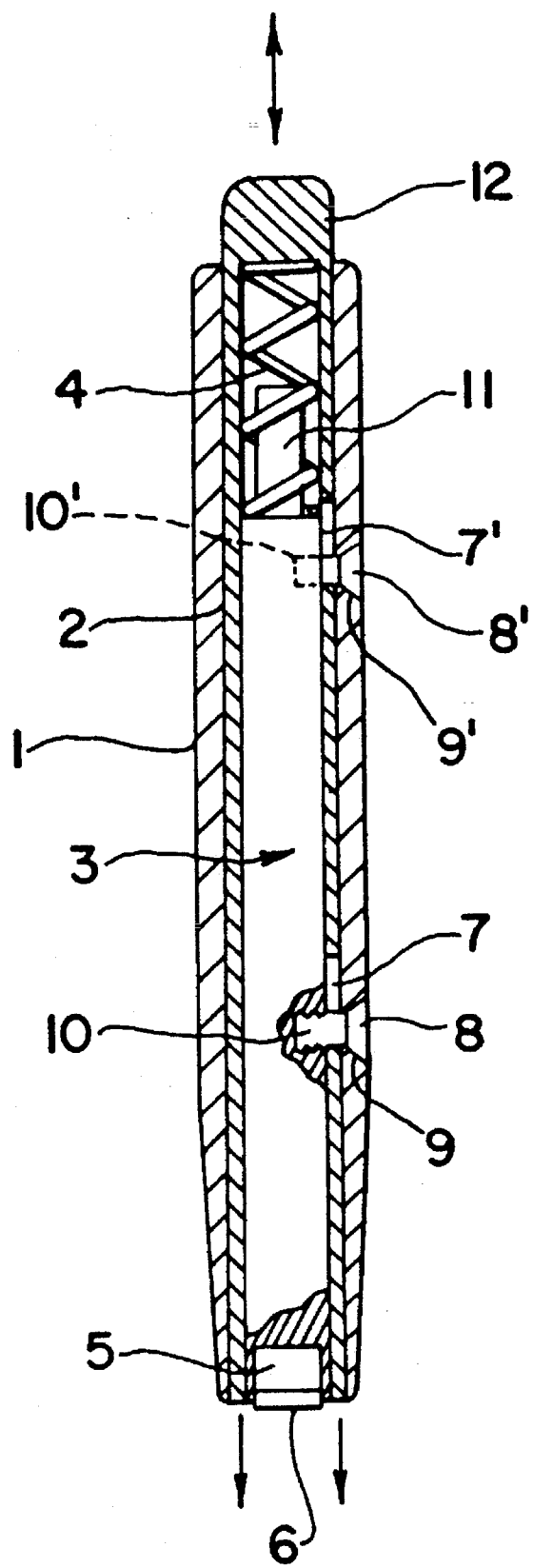
FIG. 2 is a sectional view illustrating the assembled state of an embodiment of the present invention.

Referring to FIGS. 1 and 2, there is shown a magnetic pencil which includes outer housing 1 having a tubular shape and provided with two pin holes 9 and 9'. The magnetic pencil also includes push rod 2 and insertion rod 3 for insertion into housing 1.

Push rod 2 is formed to be hollow with its upper end closed, and this closed portion of push rod 2 will constitute projected portion 12 that will project outwardly from the top of housing 1 in the assembled state (see FIG. 2).

Further, push rod 2 has guide slots 7 and 7' formed in positions corresponding to pin holes 9 and 9' of housing 1. Guide slots 7 and 7' are elongated to extend in the vertical direction in the free state of the magnetic pencil, and the length of guide slots 7 and 7' is equal to or longer than that of projected portion 12 of push rod 2.

Insertion rod 3 is inserted into hollow push rod 2, and has magnet 5 attached on the outer tip thereof and projected rod 11 extended uprightly from its top. Insertion rod 3 is provided with threaded screw holes 10 and 10' at positions corresponding to pin holes 9 and 9' of housing 1. Spring 4 is elastically installed between the top of insertion rod 3 and the closed upper end of push rod 2, by guidance of projection rod 11. As indicated in FIG. 1, projected rod 11 of insertion rod 3 fits within spring 4 (see also FIG. 2).

In the assembled state as shown in FIG. 2, guide pins 8 and 8' (shown diagrammatically in FIG. 1 as threaded screws) are provided in pin holes 9 and 9' of housing 1 and in screw holes 10 and 10' of insertion rod 3, passing through guide slots 7 and 7', respectively, as shown. Projected portion 12 of push rod 2 extends above housing 1 sufficiently so as to be able to separate a semiconductor device which may be attached to the lower end of insertion rod 3.

The distance between the top end of insertion rod 3 and the closed upper end of push rod 2, i.e., the distance between the top of projected rod 11 of insertion rod 3 and the inner ceiling of push rod 2, should be equal to or longer than the projected length of projected portion 12 of push rod 2. Guide slots 7 and 7' should be elongated in the vertical direction in the free state of the magnetic pencil, and should be equal to or longer than the length of projected portion 12 of push rod 2.

With the above construction of the preferred embodiment, the operation and effect of the present invention may be described as follows:

When the magnetic pencil is positioned uprightly as shown in FIG. 2 by the operator gripping it with his/her fingers, a semiconductor device (not shown) may be attached to magnet 5, which is slightly projected from the lower tip of the magnetic pencil. The semiconductor device may be moved as much as intended, and then, projected portion 12, which is the closed upper end of push rod 2, is pressed down. Push rod 2 then slides downward, and during this process, guide pins 8 and 8', which are fixed at pin holes 9 and 9' of housing 1 and threaded screw holes 10 and 10' of insertion rod 3, are guided along guide slots 7 and 7' of push rod 2.

Consequently, the moving down operation of push rod 2 permits the semiconductor device attached at the lower tip of insertion rod 3 of the magnetic pencil to be pushed down, thereby separating the semiconductor device from the magnetic pencil.

After separation of the semiconductor device, if the pressing of push rod 2 is discontinued, push rod 2 is restored to its original position owing to the elastic force of spring 4, which is fitted between the top portion of insertion rod 3 and the closed upper portion of push rod 2. With the provision of soft rubber 6 at the bottom of magnet 5, scratching of the semiconductor device by the magnetic pencil is prevented.

According to the present invention as described above, semiconductor packages may be caught and moved in a simple manner with a simply structured magnetic pencil, and, therefore, problems such as the dropping of semiconductor packages and the limited moving distance can be overcome.

Further, with soft rubber 6 attached on the contacting surface of the magnet, scratching of semiconductor packages can be prevented. Further, semiconductor packages may be separated by manipulating the push rod, and, therefore, contamination of semiconductor packages can be prevented.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A magnetic pencil for moving semiconductor packages, comprising:

a housing having a tubular shape and provided with pin holes;

a hollow push rod inserted into the housing, the hollow push rod having guide slots formed in positions corresponding to the pin holes of the housing;

an insertion rod inserted into the hollow push rod, the insertion rod having a magnet attached to its lower end and screw holes provided in positions corresponding to the pin holes of the housing;

a spring installed between the upper end of the insertion rod and the upper end of the hollow push rod; and guide pins for coupling the housing and the insertion rod through the guide slots of the hollow push rod, wherein the guide pins are engaged with the pin holes and screw holes and serve to guide the movement of the hollow push rod with respect to the housing and the insertion rod;

wherein a rubber material is affixed to the magnet in such a manner that a semiconductor package attracted to the magnet contacts the rubber material, wherein the semiconductor package is attracted to the magnet sufficiently to enable the magnetic pencil to move the semiconductor package, wherein movement of the push rod enables the semiconductor package to be separated from the magnetic pencil, wherein the semiconductor package may be moved with the magnetic pencil in such a manner as to prevent damage or contamination.

2. A magnetic pencil for moving semiconductor packages as claimed in claim 1, wherein the closed upper end of the hollow push rod comprises a projected portion which extends above the housing, wherein the projected portion extends above the housing sufficiently to allow separation of semiconductor packages attached on the lower end of the insertion rod.

3. A magnetic pencil for moving semiconductor packages as claimed in claim 2, wherein the insertion rod includes a projected rod that extends uprightly from the upper tip of the insertion rod and is positioned for guiding the spring.

4. A magnetic pencil for moving semiconductor packages as claimed in claim 2, wherein the guide slots are elongated in the lengthwise direction of the housing and the length of the guide slots is equal to or longer than the length of the projected portion of the hollow push rod.

5. A magnetic pencil for moving semiconductor packages as claimed in claim 1, wherein the insertion rod includes a projected rod that extends uprightly from the upper tip of the insertion rod and is positioned for guiding the spring.

6. A magnetic pencil for moving semiconductor packages as claimed in claim 5, wherein the guide slots are elongated in the lengthwise direction of the housing and the length of the guide slots is equal to or longer than the length of the projected portion of the hollow push rod.

7. A magnetic pencil for moving semiconductor packages as claimed in claim 1, wherein the guide slots are elongated in the lengthwise direction of the housing and the length of the guide slots is equal to or longer than the length of the projected portion of the hollow push rod.

8. A magnetic pencil for moving semiconductor devices comprising:

a tubular housing having an upper end and a lower end;

a tubular push rod having an upper end and a lower end, wherein the push rod is positioned inside of the housing with its upper end projecting from the top of the housing; and an insertion rod having an upper end and a lower end, wherein the insertion rod is positioned inside of the push rod and affixed to the tubular housing and is elastically engaged at its upper end with the upper end of the push rod, the insertion rod having a magnet affixed to its lower end;

wherein a semiconductor device may be attached to the magnet affixed to the lower end of the insertion rod and may be detached from the magnet affixed to the lower end of the insertion rod by movement of the push rod with respect to the housing and the insertion rod;

wherein a rubber material is affixed to the magnet in such a manner that a semiconductor device attached to the magnet contacts the rubber material, wherein the semiconductor device is attached to the magnet sufficiently to enable the magnetic pencil to move the semiconductor device, wherein movement of the push rod enables the semiconductor device to be separated from the magnetic pencil, wherein the semiconductor device may be moved with the magnetic pencil in such a manner as to prevent damage or contamination.

9. The magnetic pencil as claimed in claim 8, further comprising a spring positioned between the upper end of the insertion rod and the upper end of the push rod, the spring elastically engaging the insertion rod with the push rod, wherein the push rod is returned to an original position by the elastic force of the spring after the push rod has been moved so as to detach a semiconductor device attached to the magnet affixed to the insertion rod.

10. The magnetic pencil as claimed in claim 9, further comprising guide pins affixed to the housing and the insertion rod and positioned in guide slots formed in the push rod, the guide pins and the guide slots engaging so as to guide and limit the movement of the push rod with respect to the housing and the insertion rod.

11. The magnetic pencil as claimed in claim 8, further comprising guide pins affixed to the housing and the insertion rod and positioned in guide slots formed in the push rod, the guide pins and the guide slots engaging so as to guide and limit the movement of the push rod with respect to the housing and the insertion rod.

* * * * *